(12) United States Patent
Lee

(10) Patent No.: US 11,146,243 B2
(45) Date of Patent: Oct. 12, 2021

(54) BULK ACOUSTIC WAVE FILTER

(71) Applicant: RFHIC Corporation, Anyang (KR)

(72) Inventor: Won Sang Lee, Chapel Hill, NC (US)

(73) Assignee: RFHIC Corporation, Anyang-si (KR)

( * ) Notice: Subject to any disclaimer, the term of this patent is extended or adjusted under 35 U.S.C. 154(b) by 105 days.

(21) Appl. No.: 16/779,653

(22) Filed: Feb. 2, 2020

(65) Prior Publication Data
US 2020/0177161 A1 Jun. 4, 2020

Related U.S. Application Data

(62) Division of application No. 15/627,371, filed on Jun. 19, 2017, now Pat. No. 10,594,298.

(51) Int. Cl.
H03H 9/56 (2006.01)
H03H 3/02 (2006.01)
H03H 9/02 (2006.01)

(52) U.S. Cl.
CPC ............. H03H 9/56 (2013.01); H03H 3/02 (2013.01); H03H 9/02047 (2013.01); H03H 9/02102 (2013.01); H03H 9/564 (2013.01)

(58) Field of Classification Search
CPC ................... H03H 3/02; H03H 9/54–568
See application file for complete search history.

(56) References Cited

U.S. PATENT DOCUMENTS

| 7,713,839 | B2 * | 5/2010 | Hu ..................... H01L 23/3732 438/458 |
| 7,812,692 | B2 * | 10/2010 | Ayazi ................. H03H 3/0076 333/187 |
| 8,168,969 | B2 * | 5/2012 | Sung .................. H01L 21/3148 257/43 |
| 2007/0232074 | A1 * | 10/2007 | Ravi ................. H01L 21/02502 438/758 |
| 2012/0273775 | A1 * | 11/2012 | Sung ................. H01L 21/02521 257/43 |

* cited by examiner

Primary Examiner — Dean O Takaoka
Assistant Examiner — Alan Wong
(74) Attorney, Agent, or Firm — Patent Office of Dr. Chung Park

(57) ABSTRACT

A bulk acoustic wave (BAW) filter for passing through electric signals in a preset frequency range is provided. The BAW filter includes: a diamond substrate; a passivation layer formed on the diamond substrate; a first metal layer formed on the passivation layer; a piezoelectric layer formed on the first metal layer; a second metal layer formed on a piezoelectric layer and a metal pad formed on the first metal layer. The metal pad, first metal layer, piezoelectric layer and second metal layer form an electrical path that allows an electrical signal within a preset frequency range to pass therethrough.

20 Claims, 5 Drawing Sheets

BULK ACOUSTIC WAVE FILTER

CROSS REFERENCE TO PRIOR APPLICATIONS

This application is a divisional application of a U.S. patent application Ser. No. 15/627,371, filed on Jun. 19, 2017, which is hereby incorporated by reference in its entirety.

BACKGROUND

A. Technical Field

The present invention relates to radio frequency (RF) signal filters, and more particularly, to bulk acoustic wave (BAW) filters and methods for fabricating the bulk acoustic wave filters.

B. Background of the Invention

BAW filters, which remove signals in unwanted frequency ranges, are commonly used in various wireless frequency communication devices, such as mobile phones. As the size and weight of the mobile devices have been reduced while various functions have been added to the devices, the modern mobile devices require BAW filters with reduced form factors and enhanced quality factor. As such, during the past decade, bulk acoustic wave (BAW) filter technology has been rapidly growing to meet the requirements of the communication devices.

Typically, a BAW filter has a BAW resonator fabricated on a silicon, gallium arsenide, or glass substrate. During operation, the BAW resonator may generate heat energy that needs to be discharged outside the BAW filter through the substrate. The heat energy, if not properly discharged, may affect the resonance frequency, overall performance and durability of the BAW filter. The thermal characteristics of the conventional substrate may not be suitable for effectively removing the heat energy from the BAW resonator so that BAW filters may not be used in devices that generate large amount of heat energy.

FIGS. 10A and 10B show a process for forming a conventional BAW filter 1000. As depicted, a piezoelectric layer 1004 is deposited on a silicon wafer 1002 and a first metal layer 1006 is deposited on the piezoelectric layer 1004. Since silicon has a relatively low sound wave velocity, a portion 1010 of the silicon wafer below the operational area of the piezoelectric layer 1004 needs to be removed so that the piezoelectric layer 1004 is in direct contact with the first metal layer 1006 and the second metal layer 1008, i.e., the BAW filter has a free standing configuration. This process increases the manufacturing process. Also, the conventional manufacturing process uses a sputtering technique to deposit the piezoelectric layer 1004 on the silicon wafer 1002. However, when a sputtering technique is used, it is very difficult to control the thickness and uniformity of the piezoelectric layer 1004 if the thickness of the piezoelectric layer 1004 is less than 100 Angstrom.

As such, there is a need for a BAW filter having a mechanism to discharge the heat energy from the BAW filter in an efficient manner while the manufacturing cost of the BAW filter is reduced without compromising the quality of the piezoelectric layer.

SUMMARY OF THE DISCLOSURE

In embodiments, a method of fabricating a bulk acoustic wave filter includes: forming a piezoelectric layer; forming a first metal layer on a first surface the piezoelectric layer; forming a first passivation layer on the first metal layer; forming a seed layer of the first passivation layer, the seed layer being formed of diamond powder; forming a diamond substrate on the seed layer; forming a second metal layer on a second surface of the piezoelectric layer; removing a portion of the piezoelectric layer to expose a portion of the first metal layer; and forming a metal pad on the expose portion of the first metal layer.

In embodiments, a non-transitory computer-readable medium or media comprising one or more sequences of instructions which, when executed by one or more processors, causes steps for fabricating a bulk acoustic wave filter comprising: forming a piezoelectric layer; forming a first metal layer on a first surface the piezoelectric layer; forming a first passivation layer on the first metal layer; forming a seed layer of the first passivation layer, the seed layer being formed of diamond powder; forming a diamond substrate on the seed layer; forming a second metal layer on a second surface of the piezoelectric layer; removing a portion of the piezoelectric layer to expose a portion of the first metal layer; and forming a metal pad on the expose portion of the first metal layer.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purposes of explanation, specific details are set forth in order to provide an understanding of the disclosure. It will be apparent, however, to one skilled in the art that the disclosure can be practiced without these details. Furthermore, one skilled in the art will recognize that embodiments of the present disclosure, described below, may be implemented in a variety of ways, such as a process, an apparatus, a system, a device, or a method on a tangible computer-readable medium.

Components, or nodes, shown in diagrams are illustrative of exemplary embodiments of the disclosure and are meant to avoid obscuring the disclosure. It shall also be understood that throughout this discussion that components may be described as separate functional units, which may have sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, one skilled in the art shall recognize: (1) that certain steps may optionally be performed; (2) that steps may not be limited to the specific order set forth herein; and (3) that certain steps may be performed in different orders, including being done contemporaneously.

Elements/components shown in diagrams are illustrative of exemplary embodiments of the disclosure and are meant to avoid obscuring the disclosure. Reference in the specification to "one embodiment," "preferred embodiment," "an embodiment," or "embodiments" means that a particular feature, structure, characteristic, or function described in connection with the embodiment is included in at least one embodiment of the disclosure and may be in more than one embodiment. The appearances of the phrases "in one embodiment," "in an embodiment," or "in embodiments" in various places in the specification are not necessarily all referring to the same embodiment or embodiments. The terms "include," "including," "comprise," and "comprising" shall be understood to be open terms and any lists that follow are examples and not meant to be limited to the listed items. Any headings used herein are for organizational purposes only and shall not be used to limit the scope of the description or the claims. Furthermore, the use of certain terms in various places in the specification is for illustration and should not be construed as limiting.

Figure 1:
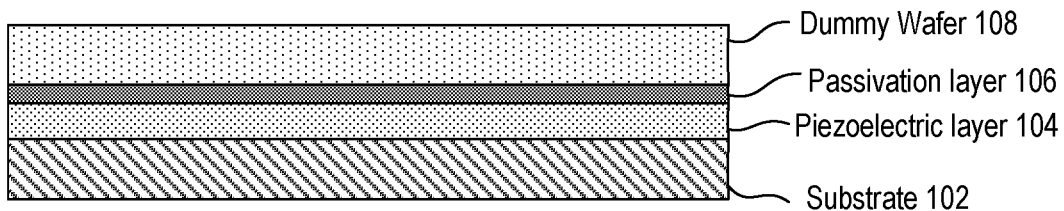
FIGS. 1-7 show an exemplary process for forming a BAW filter according to embodiments of the present disclosure.

FIGS. 1-7 show an exemplary process for forming a BAW filter according to embodiments of the present disclosure. As depicted in FIG. 1, a stack of layers 100 may include: a piezoelectric layer 104, a passivation layer 106 and a dummy wafer 108 that are sequentially stacked on a substrate 102.

In embodiments, the substrate 102 may be a semiconductor substrate, such as silicon substrate. However, it should be apparent to those of ordinary skill in the art that the substrate 102 may be formed of other suitable material insofar as the piezoelectric layer 104 may be formed on the substrate 102.

In embodiments, the piezoelectric layer 104 may be formed of a material with piezoelectric effect. In embodiments, the piezoelectric layer 104 may be formed of one or more of GaN, AlN and ZnO and deposited by the metal-organic-chemical-vapor-deposition (MOCVD) method. It should be clear that other suitable deposition techniques may be used to form the piezoelectric layer 104, depending on the materials of the substrate 102 and the piezoelectric layer 104.

It is noted that MOCVD technique is a type of epitaxial grow technique and, as such, MOCVD technique may be able to control the uniformity and thickness of the piezoelectric layer 104 better than the conventional sputtering technique. The thickness of the piezoelectric layer 104 may affect the resonance frequency characteristics of the BAW filter. Thus, the piezoelectric layer 104 formed by MOCVD technique may enhance the overall performance of the BAW filter. In embodiments, the thickness of the piezoelectric layer 104 may be 10 nm or less.

In embodiments, the passivation layer 106 may protect the piezoelectric layer 104 from thermal and mechanical damages that may occur during the BAW filter fabrication process. Also, if the dummy wafer 108 is directly attached to the piezoelectric layer 104, the mismatch of coefficients of thermal expansion (CTE) between the piezoelectric layer 104 and the dummy wafer 108 may generate stress on the piezoelectric layer 104, generating negative impact on the performance of the piezoelectric layer 104. In embodiments, the material and thickness of the passivation layer 106 may be selected to mitigate the stress due to the mismatch of CTEs. In embodiments, the passivation layer 104 may be formed of poly-Si or SiN.

In embodiments, the dummy wafer 108 may provide mechanical support to the other layers that are coupled thereto. In embodiments, the dummy wafer 108 may be formed of silicon and secured to the passivation layer 106 by being heated inside a heating chamber. It is noted that other suitable methods may be used to secure the dummy wafer 108 to the passivation layer 106. For instance, an adhesive material may be used to secure the dummy wafer 108 to the passivation layer 106.

Figure 2:
Figure 3:
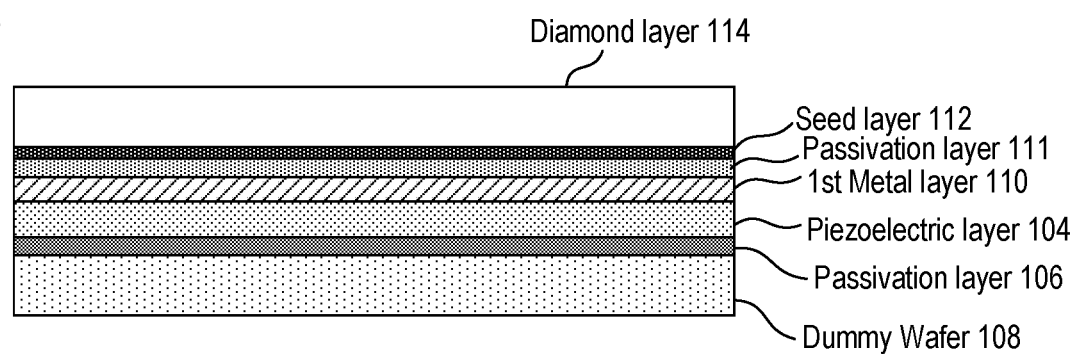

As depicted in FIG. 2, the substrate 102 may be removed from the stack of layers 100 to expose the bottom surface of the piezoelectric layer 104. Then, as depicted in FIG. 3, the stack of layers may be flipped over and multiple layers may be formed on the piezoelectric layer 104. In embodiments, the stack of layers 109 may include: a first metal layer 110, a passivation layer 111, a seed layer 112 and a diamond layer 114, where these four layers are sequentially formed on the exposed surface of the piezoelectric layer 104.

In embodiments, the first metal layer 110 may be formed of electrically conducting metal, such as Au, Ag, Ni, Ti, Al or any combination thereof. It is noted that various fabrication methods may be used to form the first metal layer 110. In embodiments, the first metal layer may be annealed to reduce the contact resistance between the first metal layer 110 and the piezoelectric layer 104.

In embodiments, a passivation layer 111 may be formed on the first metal layer 110, where the passivation layer 111 may be formed of dielectric material, such as SiN. In embodiments, to form the seed layer 112, a stack of layers including the layers 104, 106, 108, 110 and 111, may be submerged in an aqueous suspension of diamond nano particle (diamond seed particles) so that the top surface of the passivation layer 111 may be in direct contact with the aqueous suspension. The diamond particles may be adsorbed onto the surface of the passivation layer 111, to form the seed layer 112. Depending on the exposure time in the suspension and the concentration of the diamond particles, the density of the particles in the seed layer 112 may be determined. Since the diamond particles may adhere to the passivation layer 111 better than the first metal layer 110, the passivation layer 111 may enhance the particle number density of the seed layer 112.

In embodiments, the passivation layer 111 may protect the first metal layer 110 and piezoelectric layer 111 from thermal damages during the process for forming the seed layer 112 and diamond layer 114. In addition, the passivation layer 111 may electrically insulate the first metal layer 110 from the diamond layer 114.

In embodiments, the diamond layer 114 may be formed by chemical vapor deposition (CVD) technique, even though other suitable techniques may be used. In embodiments, the diamond seed particles in the seed layer 112 may act as seeds for growth of the diamond layer 114. In embodiments, the diamond layer 114 may be formed of single crystal structure or poly-crystal structure and provide mechanical support to other layers in the stack of layers 109. As such, the terms diamond layer and diamond substrate are used interchangeably.

Figure 4:
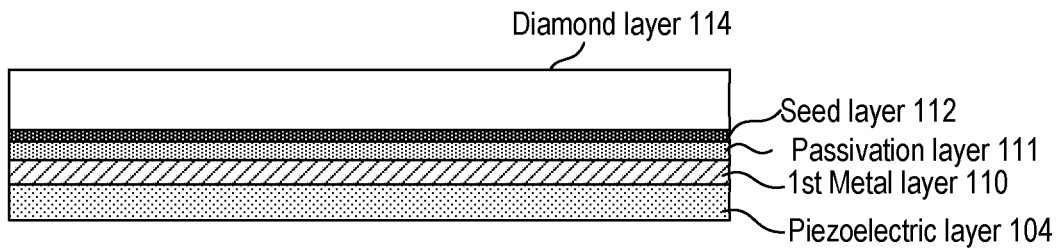

As depicted in FIG. 4, the dummy wafer 108 and the passivation layer 106 may be removed from the stack of layers 109, to thereby expose the bottom surface of the piezoelectric layer 104. In embodiments, the grinding and/or etching method may be used to remove these two layers.

Figure 5:
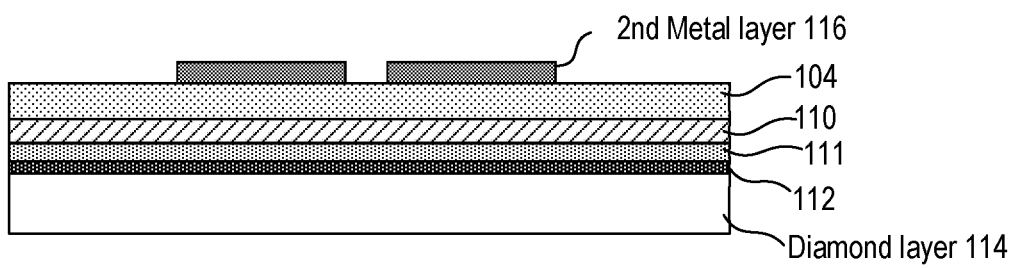
Figure 6:
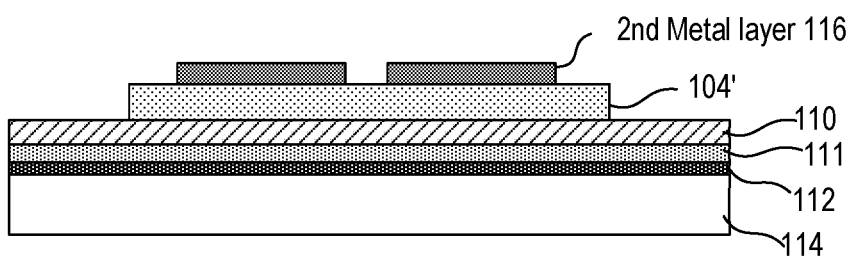

Then, as depicted in FIG. 5, a second metal layer 116 may be formed on the piezoelectric layer 104.

In embodiments, the second metal layer 116 may be formed of electrically conducting metal, such as Au, Ag, Ni, Al or Ti. It is noted that the second metal layer 116 may be fabricated by any suitable wafer fabricating processes. For instance, a metal layer may be deposited on the piezoelectric layer 104 and photolithographic technique may be used to pattern the metal layer. Then, the patterned metal layer may be annealed to form the second metal layer 116. This annealing process may decrease the contact resistance between the second metal layer and piezoelectric layer.

In embodiments, a portion of the piezoelectric layer 104 may be removed to form a patterned piezoelectric layer 104' and expose a portion of the first metal layer 110. The shape and dimension of the piezoelectric layer 104' may determine the frequency range of the signals that pass through the BAW filter. In embodiments, any suitable wafer fabrication technique, such as photolithographic technique, may be used to pattern the piezoelectric layer.

Figure 7:
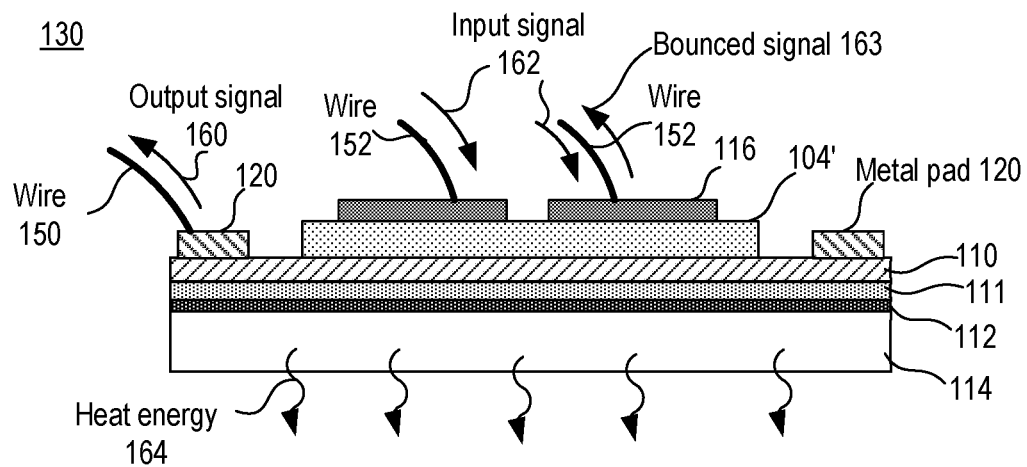
Figure 8:
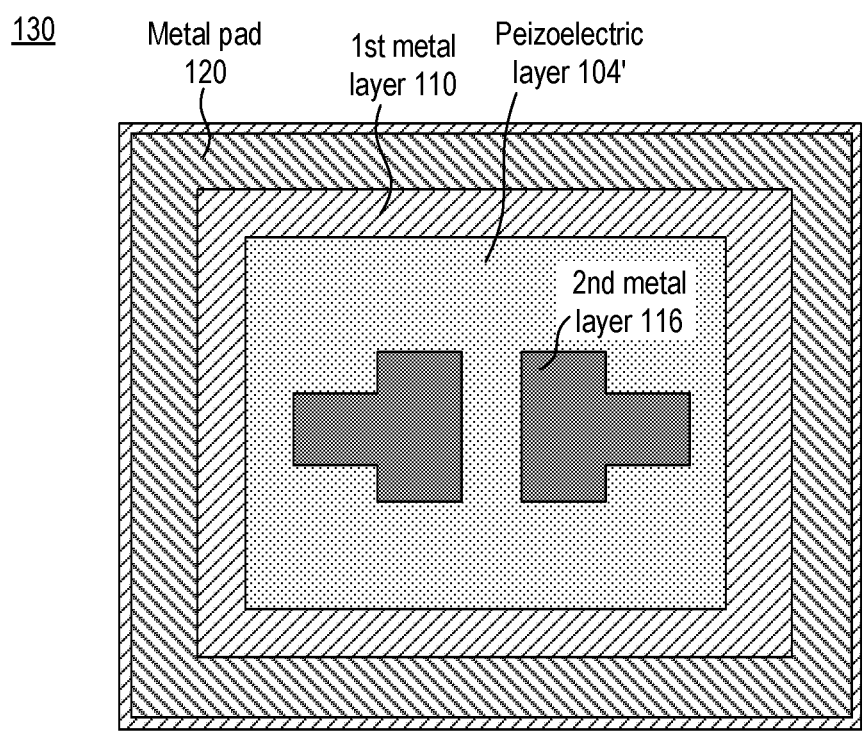
FIG. 8 is a top view of the BAW filter in FIG. 7 according to embodiments of the present disclosure.

In embodiments, a metal pad 120 may be formed on the exposed portion of the first metal layer 110, as depicted in FIG. 7. In embodiments, any suitable wafer fabrication technique, such as photolithographic technique, may be used to form the metal pad 120. FIG. 8 shows a top view of the BAW filter 130 according to embodiments of the present disclosure.

In embodiments, the BAW filter 130 may be used as a filter that allows signals within a specific frequency range to pass and discriminates signals at other frequencies. In embodiments, the metal pad 120 may be coupled to an end of one wire 150 and the second metal layer 116 may be coupled to an end of another wire(s) 152. An input signal 162, which may include electrical signals at various frequencies, may be transmitted through the wire 152 and input to the BAW filter 130. The BAW filter 130 may pass through some of the input electrical signals within a specific frequency range and transmit the signals as output signals 160 through the wire 150. The other of the input electrical signals discriminated by the BAW filter 130 may be bounced back toward the other end of the wires 152, as indicated by the arrow 163, or converted into heat energy. In embodiments, a DC bias voltage may be applied to the other end of the wires 152 to enhance the performance of RF band filtration. The heat energy may be conducted to the diamond layer (substrate) 114 and discharged outside the BAW filter as indicated by the arrows 164.

For the purpose of illustration, in FIG. 7, the signal is input through the wire 152 and output through the wire 150. However, in some cases, a signal may be input through the wire 150 and output through the wire 152, i.e., the signal flows in the direction opposite to the arrows 160 and 162. It is noted that the BAW filter 130 may operate in either signal flow direction.

For the purpose of illustration, FIG. 7 shows that only one wire 150 is directly connected to the metal pad 120. However, it should be apparent to those of ordinary skill in that are that more than one wire may be directly connected to the metal pad 120. Similarly, more than two wires may be directly coupled to the second metal layer 116 to control the wire inductance. In embodiments, to reduce wire inductance, multiple wires may be connected to the metal pad 120. Also, in embodiments, the spacing between wires may be adjusted to control the wire inductance.

In embodiments, the metal pad 120, first metal layer 110, piezoelectric layer 104' and second metal layer 116 form an electrical path that allows electrical signals within a preset frequency range to pass therethrough and discriminates electrical signals outside the present frequency range. In embodiments, the preset frequency range may be determined by various parameters, such as the shape, material and/or dimension of each of the piezoelectric layer 104', the second metal layer 116, and the metal pad 120.

During operation, a BAW filter may generate heat energy that needs to be discharged outside the BAW filter through the substrate. The heat energy, if not properly discharged, may affect the resonance frequency, overall performance and durability of the BAW filter. Unlike the conventional BAW filter that has a substrate formed of material with low thermal conductivity (such as silicon, gallium nitride or glass), the BAW filter 130 includes a diamond layer (substrate) 114 that has superior thermal conductivity. Thus, compared to the conventional BAW filters, the BAW filter 130 can efficiently discharge the heat energy and thus, the overall performance and durability of the BAW filter 130 would be affected less by the heat energy during operation.

Figure 9:
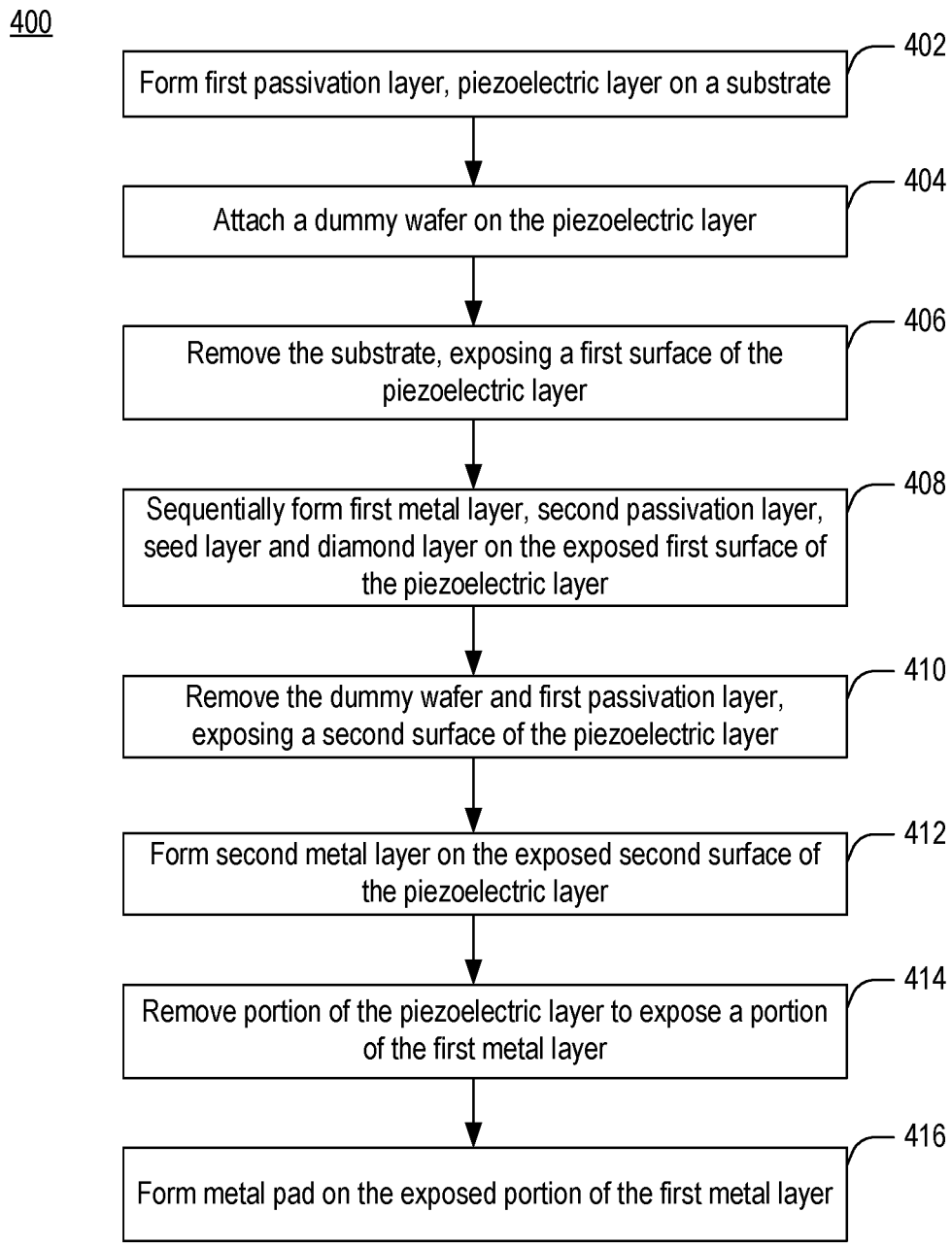
FIG. 9 shows a flowchart of an exemplary process for fabricating a BAW filter according to embodiments of the present disclosure.

FIG. 9 shows a flowchart 400 of an exemplary process for fabricating a BAW filter according to embodiments of the present invention. At step 402, a piezoelectric layer and a first passivation layer may be sequentially formed on a substrate. In embodiments, the piezoelectric layer may be formed of a material, such as GaN, AlN and ZnO, with piezoelectric effect and deposited by the metal-organic-chemical-vapor-deposition (MOCVD) method. It should be clear that other suitable types of deposition techniques may be used to form the piezoelectric layer, depending on the materials of the first substrate and the piezoelectric layer. In embodiments, the first passivation layer may be formed of dielectric material, such as poly-Si or SiN, and protect the piezoelectric layer from thermal and mechanical damages that may occur during the BAW filter fabrication process.

At step 404, a dummy wafer, such as silicon wafer, may be attached to the first passivation layer. In embodiments, the dummy wafer may be attached to the first passivation layer by heating or using adhesive material. In embodiments, the first passivation layer may mitigate the stress due to the mismatch of CTEs between the dummy wafer and the piezoelectric layer.

At step 406, the substrate may be removed, exposing a first surface of the piezoelectric layer. Then, as step 408, a first metal layer, a second passivation layer, a seed layer and a diamond layer (substrate) may be sequentially formed on the exposed first surface of the piezoelectric layer. In embodiments, the first metal layer may be formed of electrically conducting metal. In embodiments, the first metal layer may be deposited on the exposed first surface of the piezoelectric layer. In embodiments, the first metal layer may be annealed to reduce the contact resistance between the first metal layer and the piezoelectric layer. In embodiments, the second passivation layer may be formed of dielectric material, such as SiN. The second passivation layer may protect the first metal layer and piezoelectric layer from thermal damages during the process for forming the seed layer and diamond layer. In addition, the second passivation layer may electrically insulate the first metal layer from the seed layer and the diamond layer.

To form the seed layer, the stack of layers including the diamond layer, first passivation layer, piezoelectric layer, first metal layer and the second passivation layer, may be submerged in an aqueous suspension of diamond nano particles (diamond seed particles) so that a surface of the second passivation layer may be in direct contact with the aqueous suspension. In embodiments, the diamond seed particles may be adsorbed onto the surface of the second passivation layer, to form the diamond seed layer. Depending on the exposure time in the suspension and the concentration of the diamond particles, the number density of the particles in the seed layer may be determined. Since the diamond particles may adhere to the second passivation layer better than the first metal layer, the second passivation layer may enhance the particle number density of the seed layer. In embodiments, the diamond layer (substrate) may be grown on the seed layer by the CVD technique.

At step 410, the dummy wafer and the first passivation layer may be removed to expose a second surface of the piezoelectric layer. Then, at step 412, a second metal layer, which is formed of electrically conducting metal, may be formed on the exposed second surface of the piezoelectric layer. In embodiments, the second metal layer may be formed by depositing and patterning a metal layer and annealing the patterned metal layer.

At step 414, a portion of the piezoelectric layer may be removed to expose a portion of the first metal layer. In embodiments, a suitable etching technique may be used to remove the portion of the piezoelectric layer. Then, at step 416, a metal pad may be formed on the exposed surface of the first metal layer. In embodiments, suitable techniques may be used to deposit and pattern a metal layer. In embodiments, to reduce the contact resistance between the metal pad and the first metal layer, the patterned metal layer may be annealed.

Figure 10A:
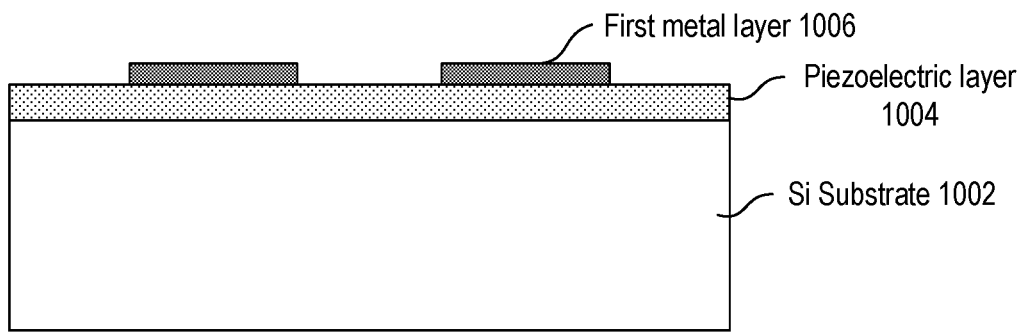
FIGS. 10A and 10B show a process for forming a conventional BAW filter.
Figure 10B:
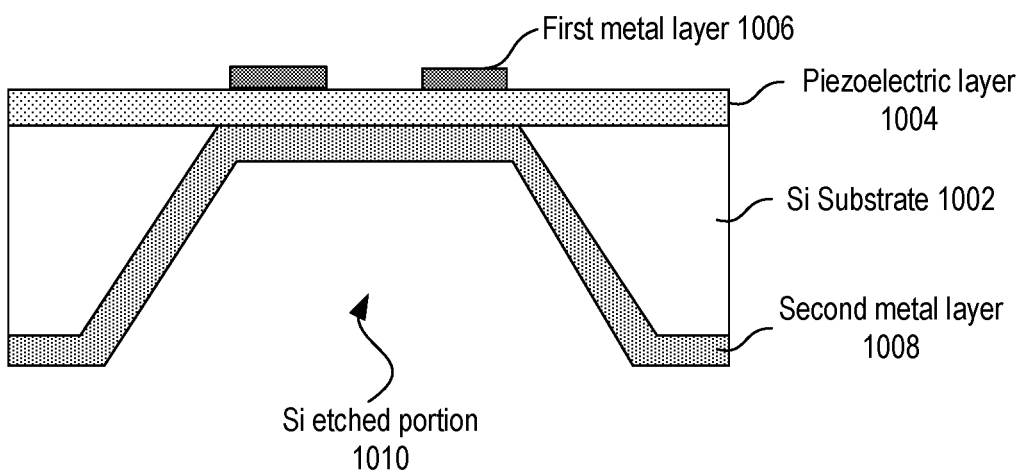

As discussed above in conjunction with FIGS. 10A and 10B, in conventional BAW filters, a portion 1010 of the silicon substrate 1002 needs to be removed so that the first metal layer 1006 and the second metal layer 1008 are in direct contact with the piezoelectric layer 1004. In conventional systems, this etching process is necessary since silicon has low sound wave velocity. In contrast, unlike the manufacturing process of the conventional BAW filters, in embodiments of the present disclosure, the entire portion of the substrate 102 may be removed after the dummy wafer 108 is attached to the passivation layer 106, obviating the conventional etching process to thereby reduce the manufacturing cost.

In embodiments, the heat energy generated during operation of the BAW filter 130 may be effectively discharged outside the BAW filter since the diamond layer (substrate) 114 has a high thermal conductivity. As such, the operational characteristics of the BAW filter may be less affected by the heat energy, compared to the conventional BAW filter that has a substrate formed of conventional substrate material, such as silicon, sapphire or glass.

One or more of the processes describe in conjunction with FIG. 9 may be performed by computer software. It shall be noted that embodiments of the present disclosure may further relate to computer products with a non-transitory, tangible computer-readable medium that have computer code thereon for performing various computer-implemented operations. The media and computer code may be those specially designed and constructed for the purposes of the present disclosure, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present disclosure. One skilled in the art will also recognize that a number of the elements described above may be physically and/or functionally separated into sub-modules or combined together.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for fabricating a bulk acoustic wave filter, comprising:
   forming a piezoelectric layer;
   forming a first metal layer on a first surface the piezoelectric layer;
   forming a first passivation layer on the first metal layer;
   forming a seed layer of the first passivation layer, the seed layer being formed of diamond powder;
   forming a diamond substrate on the seed layer;
   forming a second metal layer on a second surface of the piezoelectric layer;
   removing a portion of the piezoelectric layer to expose a portion of the first metal layer; and
   forming a metal pad on the expose portion of the first metal layer.

2. The method of claim 1, wherein the step of forming a diamond substrate includes:
   growing the diamond substrate on the seed layer.

3. The method of claim 1, wherein the step of forming a piezoelectric layer includes:
   forming the piezoelectric layer on a substrate;
   forming a second passivation layer on the piezoelectric layer; and
   forming a dummy wafer on the second passivation layer; and
   removing the substrate.

4. The method of claim 3, further comprising:
   removing the dummy wafer and the second passivation layer after the step of forming the diamond substrate.

5. The method of claim 3, wherein the dummy wafer is formed of silicon.

6. The method of claim 1, wherein the piezoelectric layer includes at least one of GaN, AlN and ZnO.

7. The method of claim 1, wherein each of the first metal layer, second metal layer and metal pad is formed of an electrically conducting metal.

8. The method of claim 1, wherein the first passivation layer includes at least one of poly-Si and SiN.

9. The method of claim 1, wherein the first passivation layer is formed of a dielectric material.

10. The method of claim 1, wherein the diamond substrate has at least one of a single crystal structure and a poly-crystal structure.

11. A non-transitory computer-readable medium or media comprising one or more sequences of instructions which, when executed by one or more processors, causes steps for fabricating a bulk acoustic wave filter comprising:
    forming a piezoelectric layer;
    forming a first metal layer on a first surface the piezoelectric layer;
    forming a first passivation layer on the first metal layer;
    forming a seed layer of the first passivation layer, the seed layer being formed of diamond powder;
    forming a diamond substrate on the seed layer;
    forming a second metal layer on a second surface of the piezoelectric layer;
    removing a portion of the piezoelectric layer to expose a portion of the first metal layer; and
    forming a metal pad on the expose portion of the first metal layer.

12. The non-transitory computer readable medium of claim 11, wherein the step of forming a diamond substrate includes the steps of:
    growing the diamond substrate on the seed layer.

13. The non-transitory computer readable medium of claim 11, wherein the step of forming a piezoelectric layer includes the steps of:
    forming the piezoelectric layer on a substrate;
    forming a second passivation layer on the piezoelectric layer;
    forming a dummy wafer on the second passivation layer;
    removing the substrate.

14. The non-transitory computer readable medium of claim 13, further comprising one or more sequences of instructions which, when executed by one or more processors, causes steps to be performed comprising:
    removing the dummy wafer and the second passivation layer after the step of forming the diamond substrate.

15. The non-transitory computer readable medium of claim 13, wherein the dummy wafer is formed of silicon.

16. The non-transitory computer readable medium of claim 11, wherein the piezoelectric layer includes at least one of GaN, AlN and ZnO.

17. The non-transitory computer readable medium of claim 11, wherein each of the first metal layer, second metal layer and metal pad is formed of an electrically conducting metal.

18. The non-transitory computer readable medium of claim 11, wherein the first passivation layer includes at least one of poly-Si and SiN.

19. The non-transitory computer readable medium of claim 11, wherein the first passivation layer is formed of a dielectric material.

20. The non-transitory computer readable medium of claim 11, wherein the diamond substrate has at least one of a single crystal structure and a poly-crystal structure.

* * * * *